(12) United States Patent
Kwon

(10) Patent No.: US 7,821,329 B2
(45) Date of Patent: Oct. 26, 2010

(54) PUMPING VOLTAGE GENERATING CIRCUIT AND SEMICONDUCTOR MEMORY APPARATUS USING THE SAME

(75) Inventor: Jae Kwan Kwon, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/345,075

(22) Filed: Dec. 29, 2008

(65) Prior Publication Data

US 2010/0033233 A1 Feb. 11, 2010

(30) Foreign Application Priority Data

Aug. 8, 2008 (KR) ...................... 10-2008-0077697

(51) Int. Cl.
*G05F 1/10* (2006.01)
*G05F 3/02* (2006.01)

(52) U.S. Cl. ........................ 327/536; 327/535; 327/537; 363/59

(58) Field of Classification Search ................. 327/148, 327/157, 534–537; 363/59, 60
See application file for complete search history.

(56) References Cited

U.S. PATENT DOCUMENTS 5,059,815 A * 10/1991 Bill et al. ..................... 327/536

2003/0011420 A1 * 1/2003 Kawai et al. ................. 327/536
2004/0239409 A1 12/2004 Jang et al.
2007/0241808 A1 10/2007 Choi
2009/0244940 A1 * 10/2009 Wu ............................. 363/60

FOREIGN PATENT DOCUMENTS

JP 2004355788 12/2004
KR 1019980015331 5/1998
KR 1020010005266 A 1/2001

* cited by examiner

*Primary Examiner*—Lincoln Donovan
*Assistant Examiner*—Brandon S Cole
(74) *Attorney, Agent, or Firm*—Baker & McKenzie LLP

(57) ABSTRACT

A pumping voltage generating circuit in a semiconductor memory apparatus includes a voltage supplying unit configured to supply an external power supply voltage to a first node in response to a first transfer signal, a node control unit configured to couple the first node to a second node in response to a second transfer signal and to couple the second node to an output node in response to a third transfer signal, a first pumping unit configured to increase a voltage level on the first node through a pumping operation that is performed in response to a first oscillation signal and to control one of an amount of voltage increment and decrement on the first node in response to a first control signal, and a second pumping unit configured to increase a voltage level on the second node through a pumping operation that is performed in response to a second oscillation signal and to control one of an amount of voltage increment and decrement on the second node in response to a second control signal.

21 Claims, 3 Drawing Sheets

PUMPING VOLTAGE GENERATING CIRCUIT AND SEMICONDUCTOR MEMORY APPARATUS USING THE SAME

CROSS-REFERENCES TO RELATED APPLICATION

The present application claims priority under 35 U.S.C. §119(a) to Korean application number 10-2008-0077697, filed on Aug. 8, 2008, in the Korean Intellectual Property Office, which is incorporated herein by reference in its entirety as if set forth in full.

BACKGROUND

1. Technical Field

The embodiments described herein relate to a semiconductor memory apparatus, and more particularly, to a pumping voltage generating circuit and a semiconductor memory apparatus using the same.

2. Related Art

FIG. 1 is a schematic circuit diagram of a conventional pumping voltage generating circuit of a semiconductor memory apparatus. In FIG. 1, a pumping voltage generating circuit 1 of a semiconductor memory apparatus includes a first pump capacitor pump_cap1, a second pump capacitor pump_cap2, a first transistor N1, a second transistor N2, and a third transistor N3.

The first pump capacitor pump_cap1 performs a pumping operation in response to a first oscillation signal 'osc1', and the second pump capacitor pump_cap2 performs a pumping operation in response to a second oscillation signal 'osc2'.

The first transistor N1 transfers an external power supply voltage VDD to a first node (node_A) in response to a first transfer signal 'trans1', and the second transistor N2 connects the first node (node_A) to a second node (node_B) in response to a second transfer signal 'trans2'. In addition, the third transistor N3 connects the second node (node_B) to an output node (node_out) in response to a third transfer signal 'trans3'. Here, an output of the output node (node_out) forms the pumping voltage VPP.

During operation of the pumping voltage generating circuit 1, when the first transfer signal 'trans1' is enabled, the first transistor N1 is turned ON so that the voltage level on the first node (node_A) increases up to the external power supply voltage VDD. When the voltage level of the first node (node_A) becomes the voltage level of the external power supply voltage VDD level, the first transfer signal 'trans1' is disabled. Then, the first transistor N1 is turned OFF.

Next, when the first transistor N1 is turned OFF, the first oscillation signal 'osc1' is transitioned from a ground voltage level to the external power supply voltage VDD level. The first pump capacitor pump_cap1 carries out the pumping operation at a rising timing of the first oscillation signal 'osc1' and increases the voltage level on the first node (node_A). Here, the voltage level on the first node (node_A) is ideally twice as much as that of the external power supply voltage VDD.

Then, if the voltage level of the first node (node_A) is twice as much as that of the external power supply voltage VDD, then the second transfer signal 'trans2' is enabled and the second transistor N2 is turned ON. Next, when the second transistor N2 is turned ON, the voltage level of the second node (node_B) is twice as much as the voltage level of the external power supply voltage VDD because the first node (node_A) is connected to the second (node_B). If the voltage level of the second node (node_B) is twice as much as the voltage level of the external power supply voltage VDD, then the second transfer signal 'trans2' is disabled and the second transistor N2 is turned OFF.

When the second transistor N2 is turned OFF, the second oscillation signal 'osc2' is transitioned from the ground voltage level to the external power supply voltage VDD level. The second pump capacitor pump_cap2 carries out the pumping operation at a rising timing of the second oscillation signal 'osc2' and increases the voltage level on the second node (node_B). Here, the voltage level on the second node (node_B) is ideally three times as much as the voltage level of the external power supply voltage VDD.

If the voltage level of the second node (node_B) is three times as much as the voltage level of the external power supply voltage VDD, then the third transfer signal 'trans3' is enabled and the third transistor N3 is turned ON. When the third transistor N3 is turned ON, the voltage level of the output node (node_out) is three times as much as the voltage level of the external power supply voltage VDD because the second node (node_B) is connected to the output node (node_out). As a result, the voltage level of the output node (node_out) is output as the pumping voltage VPP.

In general, the efficiency of the pumping voltage generating circuit 1 is determined by a ratio of an amount of current consumed in the first and second pump capacitors pump_cap1 and pump_cap2 to the voltage increment of the first to second nodes (node_A) and (node_B)

A large-sized pump capacitor can be used to increase the efficiency of the pumping voltage generating circuit 1. However, this increment of the capacitor size reduces the area efficiency of the semiconductor memory apparatus and increases the current consumption of the apparatus. Accordingly, it is necessary to improve the efficiency of the pumping voltage generating circuit 1 to implement the low-power semiconductor memory apparatus.

SUMMARY

A pumping voltage generating circuit capable of improving pumping efficiency in a semiconductor memory apparatus and a semiconductor memory device using the same are described herein.

In one aspect, a pumping voltage generating circuit in a semiconductor memory apparatus includes a voltage supplying unit configured to supply an external power supply voltage to a first node in response to a first transfer signal, a node control unit configured to couple the first node to a second node in response to a second transfer signal and to couple the second node to an output node in response to a third transfer signal, a first pumping unit configured to increase a voltage level on the first node through a pumping operation that is performed in response to a first oscillation signal and to control one of an amount of voltage increment and decrement on the first node in response to a first control signal, and a second pumping unit configured to increase a voltage level on the second node through a pumping operation that is performed in response to a second oscillation signal and to control one of an amount of voltage increment and decrement on the second node in response to a second control signal.

In another aspect, a pumping voltage generating circuit in a semiconductor memory apparatus includes a pumping unit configured to increase capacitance before one of rising timing and falling timing of an oscillation signal at a first phase, to decrease capacitance at a second phase of the oscillation signal, and to perform a pumping operation in response to the oscillation signal, wherein the second phase of the oscillation signal is out of phase with the first phase of the oscillation signal.

In another aspect, a semiconductor memory apparatus includes a pumping voltage generating circuit having a voltage supplying unit configured to supply an external power supply voltage to a first node in response to a first transfer signal, a node control unit configured to couple the first node to a second node in response to a second transfer signal, and a plurality of pumping units configured to increase a voltage level on one of the first node and the second node through a pumping operation performed in response to one of a first oscillation signal and a second oscillation signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
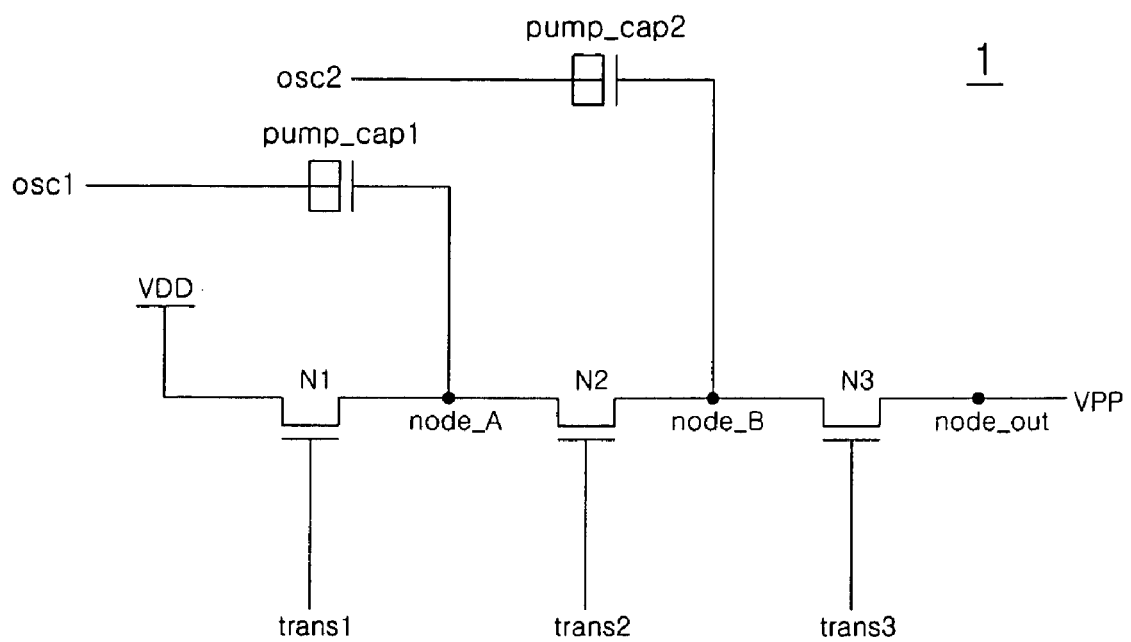
FIG. 1 is a schematic circuit diagram of a conventional pumping voltage generating circuit of a semiconductor memory apparatus.
Figure 2:
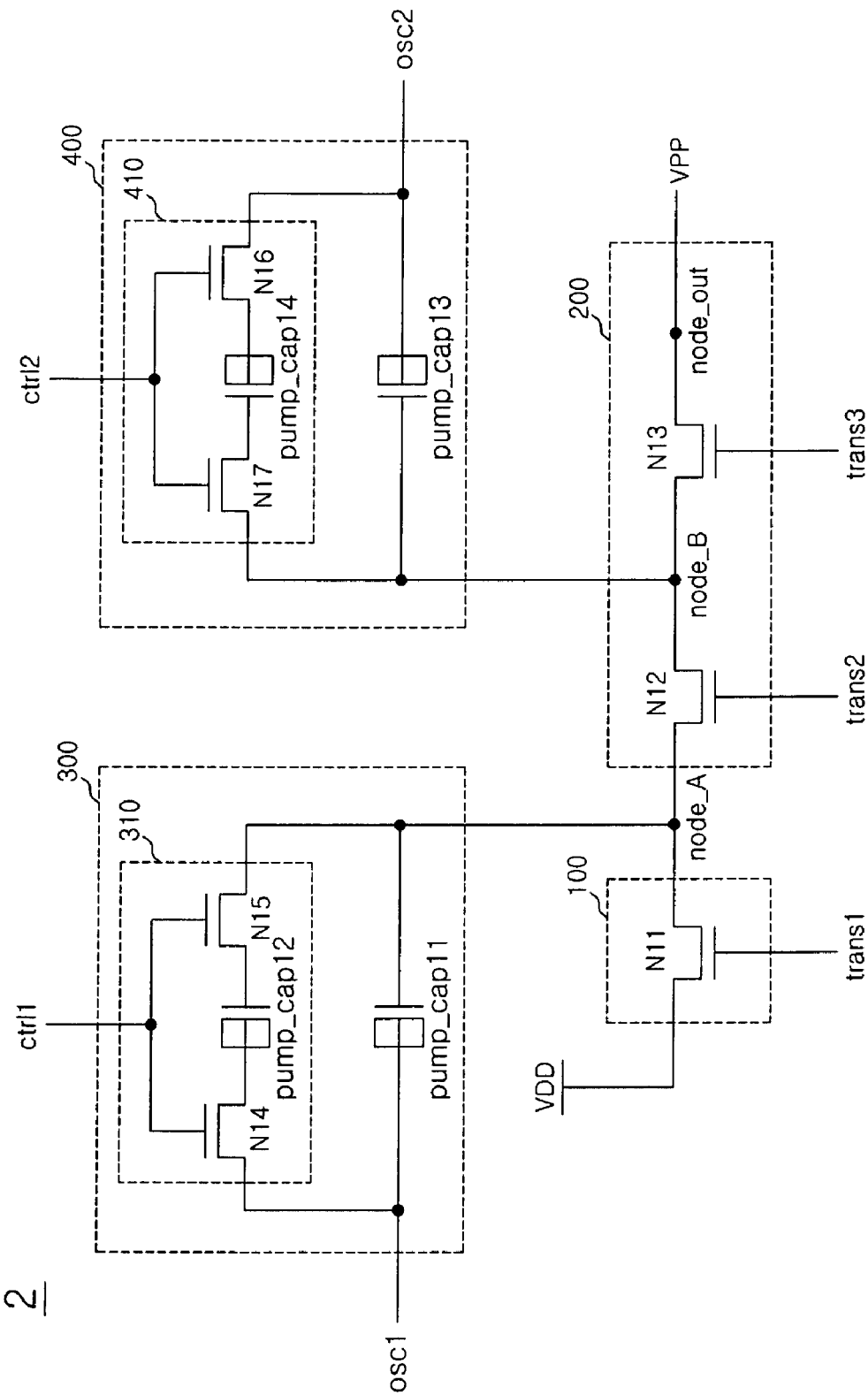
FIG. 2 is a schematic circuit diagram of an exemplary pumping voltage generating circuit of a semiconductor memory apparatus according to one embodiment.

FIG. 2 is a schematic circuit diagram of an exemplary pumping voltage generating circuit 2 of a semiconductor memory apparatus according to one embodiment. In FIG. 2, the pumping voltage generating circuit 2 of a semiconductor memory apparatus can be configured to include a voltage supply unit 100, a node control unit 200, a first pumping unit 300, and a second pumping unit 400.

The voltage supply unit 100 can supply an external power supply voltage VDD for a first node (node_A) in response to a first transfer signal 'trans1'. For example, when the first transfer signal 'trans1' is activated, the voltage supply unit 100 can supply the external power supply voltage VDD to the first node (node_A).

The voltage supply unit 100 can include a first transistor N11 having a gate terminal to which the first transfer signal 'trans1' can be supplied, a drain terminal to which the external power supply voltage VDD can be supplied, and a source terminal connected to the first node (node_A).

The node control unit 200 can connect the first node (node_A) to a second node (node_B), and can connect the second node (node_B) to an output node (node_out) in response to second and third transfer signals 'trans2' and 'trans3', respectively. For example, when the second transfer signal 'trans2' is activated, the node control unit 200 can connect the first node (node_A) to the second node (node_B). When the third transfer signal 'trans3' is activated, the node control unit 200 can connect the second node (node_B) to the output node (node_out).

The node control unit 200 can include second and third transistors N12 and N13, wherein the second transistor N12 can have a gate terminal to which the second transfer signal 'trans2' can be supplied, and drain and source terminals can be connected to the first node (node_A) and the second node (node_B), respectively. The third transistor N13 can have a gate terminal to which the third transfer signal 'trans3' can be supplied, and drain and source terminal that can be connected to the second node (node_B) and the output node (node_out), respectively.

The first pumping unit 300 can boost the voltage level on the first node (node_A) through a pumping operation that can be carried out in response to a first oscillation signal 'osc1', and can control the increment and decrement of the voltage level on the first node (node_A) in response to a first control signal 'ctrl1'. The first pumping unit 300 can be configured to have a high capacitance when the first control signal 'ctrl1' is activated, and can be configured to have a low capacitance when the first control signal 'ctrl1' is inactivated.

For example, the first pumping unit 300 can include a first pump capacitor pump_cap11 and a first control pump 310. The first pump capacitor pump_cap11 can perform a pumping operation according to the first oscillation signal 'osc1'. Here, the first oscillation signal 'osc1' can be supplied to one end of the first pump capacitor pump_cap11, and the first node (node_A) can be connected to the other end of the first pump capacitor pump_cap11. Accordingly, when the first control signal 'ctrl1' is activated, the first control pump 310 can perform a pumping operation according to the first oscillation signal 'osc1'.

The first control pump 310 can include a second pump capacitor pump_cap12 and fourth and fifth transistors N14 and N15.

The fourth transistor N14 can have a gate terminal to which the first control signal 'ctrl1' can be supplied, a drain terminal to which the first oscillation signal 'osc1' can be supplied, and a source terminal to which one end of the second pump capacitor pump_cap12 can be connected. When the first control signal 'ctrl1' is activated, the fourth transistor N14, which can be used as a switch, can be turned ON, and can then transfer the first oscillation signal 'osc1' to the second pump capacitor pump_cap12.

The fifth transistor N15 can have a gate terminal to which the first control signal 'ctrl1' can be supplied, a drain terminal to which the other end of the second pump capacitor pump_cap12 can be connected, and a source terminal to which the first node (node_A) can be connected. When the first control signal 'ctrl1' is activated, the fifth transistor N15, which can be used as a switch, can be turned ON, and can then connect the other end of the second pump capacitor pump_cap12 to the first node (node_A).

One end of the second pump capacitor pump_cap12 can be connected to the source terminal of the fourth transistor N14, and the other end of the second pump capacitor pump_cap12 can be connected to the drain terminal of the fifth transistor N15.

The second pumping unit 400 can boost the voltage level on the second node (node_B) through a pumping operation that can be carried out in response to a second oscillation signal 'osc2', and can control the increment and decrement of the voltage level on the second node (node_B) in response to a second control signal 'ctrl2'. In addition, the second pumping unit 400 can be configured to have a high capacitance when the second control signal 'ctrl2' is activated, and can be configured to have a low capacitance when the second control signal 'ctrl2' is inactivated. For example, the second pumping unit 400 can include a third capacitor pump_cap13 and a second control pump 410.

The third pump capacitor pump_cap13 can perform a pumping operation according to the second oscillation signal 'osc2'.

The second oscillation signal 'osc2' can be supplied to one end of the third pump capacitor pump_cap13, and the second node (node_B) can be connected to the other end of the third pump capacitor pump_cap13.

When the second control signal 'ctrl2' is activated, the second control pump 410 can perform a pumping operation according to the second oscillation signal 'osc2'. For example, the second control pump 410 can include a fourth pump capacitor pump_cap14 and sixth and seventh transistors N16 and N17.

The sixth transistor N16 can have a gate terminal to which the second control signal 'ctrl2' can be supplied, a drain terminal to which the second oscillation signal 'osc2' can be supplied, and a source terminal to which one end of the fourth pump capacitor pump_cap14 can be connected. When the second control signal 'ctrl2' is activated, the sixth transistor N16, which can be used as a switch, can be turned ON, and can then transfer the second oscillation signal 'osc2' to the fourth pump capacitor pump_cap14.

The seventh transistor N17 can have a gate terminal to which the second control signal 'ctrl2' can be supplied, a drain terminal to which the other end of the fourth pump capacitor pump_cap14 can be connected, and a source terminal to which the second node (node_B) can be connected. When the second control signal 'ctrl2' is activated, the seventh transistor N17, which can be used as a switch, can be turned ON, and can then connect the other end of the fourth pump capacitor pump_cap14 to the second node (node_B).

One end of the fourth pump capacitor pump_cap14 can be connected to the source terminal of the sixth transistor N16. and the other end of the fourth pump capacitor pump_cap14 can be connected to the drain terminal of the seventh transistor N17.

An exemplary operation of the pumping voltage generating circuit will be described with reference to FIG. 2.

When the first transfer signal 'trans1' is activated, the voltage supply unit 100 can supply the external power supply voltage VDD to the first node (node_A). When the first transfer signal 'trans1' is inactivated, the external power supply voltage VDD can not be supplied to the first node (node_A) any longer.

After the first transfer signal 'trans1' is inactivated, the first control signal 'ctrl1' is activated. Then, when the first control signal 'ctrl1' is activated, the first control pump 310 can perform the pumping operation according to the first oscillation signal 'osc1'.

When the first control signal 'ctrl1' is activated, the first pump capacitor pump_cap11 and the second pump capacitor pump_cap12 of the first control pump 310 can perform the pumping operation at the time the first oscillation signal 'osc1' is transitioned to a high level and then the voltage level on the first node (node_A) is increased.

If the second transfer signal 'trans2' is activated after the voltage level on the first node (node_A) is increased, then the first node (node_A) can be connected to the second node (node_B) so that the voltage level on the first node (node_A) can be substantially the same as the voltage level on the second node (node_B) through the charge sharing.

When the second transfer signal 'trans2' is inactivated, the first node (node_A) can be separated from the second node (node_B).

After the second transfer signal 'trans2' is inactivated, the first control signal 'ctrl1' can be inactivated. If the first control signal 'ctrl1' is inactivated, then the second pump capacitor pump_cap12 does not receive the first oscillation signal 'osc1', and the first node (node_A) can be separated from the second pump capacitor pump_cap12. After the first control signal 'ctrl1' is inactivated, the first oscillation signal 'osc1' can be transitioned to a low level.

If the first oscillation signal 'osc1' is transitioned to a low level, then the first pump capacitor pump_cap11 can drop the voltage level on the first node (node_A). At this time, the first node (node_A) can be connected to the two pump capacitors pump_cap11 and pump_cap12 when the first oscillation signal 'osc1' is transitioned to a high level. In addition, the first node (node_A) can be connected to only the first pump capacitor pump_cap11 when the first oscillation signal 'osc1' is transitioned to a low level. For example, the first pumping unit 300 can provide the voltage level to the first node (node_A) in such a manner that the capacitance generated when the first oscillation signal 'osc1' is transitioned to a high level is twice as much as that generated when the first oscillation signal 'osc1' is transitioned to a low level.

After the first node (node_A) is separated from the second node (node_B), the second control signal 'ctrl2' can be activated. If the second control signal 'ctrl2' is activated, then the third and fourth pump capacitors pump_cap13 and pump_cap14 can perform the pumping operation according to the second oscillation signal 'osc2'.

After the second control signal 'ctrl2' is activated, the third pump capacitor pump_cap13 and the fourth pump capacitor pump_cap14 can perform the pumping operation at the time the second oscillation signal 'osc2' is transitioned to a high level, and then the voltage level on the second node (node_B) can be increased.

If the third transfer signal 'trans3' is activated after the voltage level on the second node (node_B) is increased, then the second node (node_B) can be connected to the output node (node_out) so that the voltage level on the second node (node_B) can be substantially the same as the voltage level on the output node (node_out) through the charge sharing. A voltage level on the output node (node_out) can be output as the pumping voltage VPP.

When the third transfer signal 'trans3' is inactivated, the second node (node_B) can be separated from the output node (node_out). After the second node (node_B) is separated from the output node (node_out), the second control signal 'ctrl2' can be inactivated. If the second control signal 'ctrl2' is inactivated, then the fourth pump capacitor pump_cap14 does not receive the second oscillation signal 'osc2', and the second node (node_B) can be separated from the fourth pump capacitor pump_cap14. After the second node (node_B) is separated from the fourth pump capacitor pump_cap14, the second oscillation signal 'osc2' can be transitioned to a low level.

If the second oscillation signal 'osc2' is transitioned to a low level, then the third pump capacitor pump_cap13 can drop the voltage level on the second node (node_B). At this time, the second node (node_B) can be connected to the two pump capacitors pump_cap13 and pump_cap14 when the second oscillation signal 'osc2' is transitioned to a high level. In addition, the second node (node_B) can be connected to only the third pump capacitor pump_cap13 when the second oscillation signal 'osc2' is transitioned to a low level. For example, the second pumping unit 400 can provide the voltage level to the second node (node_B) in such a manner that the capacitance generated when the second oscillation signal 'osc2' is transitioned to a high level can be twice as much as that generated when the second oscillation signal 'osc2' is transitioned to a low level.

As a result, in the first and second pumping units 300 and 400 included in the pumping voltage generating circuit 2, the voltage increment of the voltage generated at the first and second nodes (node_A) and (node_B), when the first and second oscillation signals 'osc1' and 'osc2' are transitioned to a high level, can be twice as much as the voltage decrement generated at the first and second nodes (node_A) and (node_B) when the first and second oscillation signals 'osc1' and 'osc2' are transitioned to a low level.

Figure 3:
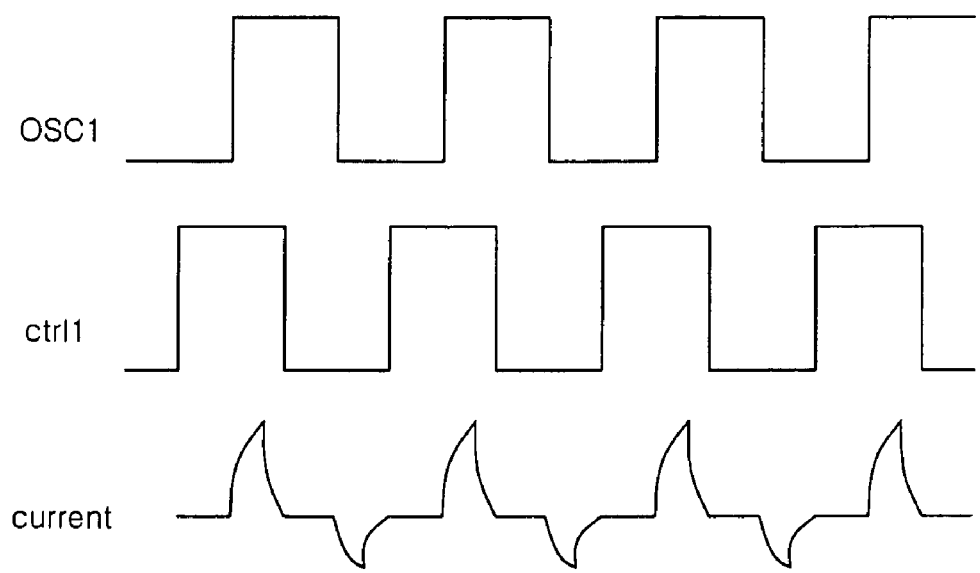
FIG. 3 is a timing chart showing an exemplary operation of the pumping voltage generating circuit of FIG. 2 according to one embodiment.

FIG. 3 is a timing chart showing an exemplary operation of the pumping voltage generating circuit 2 of FIG. 2 according to one embodiment. In FIG. 3, an exemplary operation of the first and second pumping units 300 and 400 will be described. The first pumping unit 300 can have substantially the same configuration as the second pumping unit 400. Accordingly, only the first pumping unit 300 will be described below.

The first control signal 'ctrl1' is in a high level section at the time the first oscillation signal 'osc1' is transitioned to a high level, and is in a low level section at the time the first oscillation signal 'osc1' is transitioned to a low level.

Figure 4:
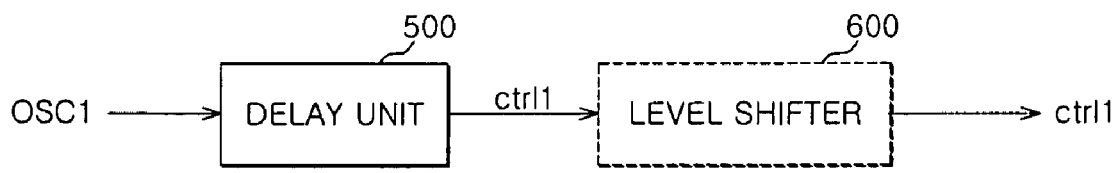
FIG. 4 is a schematic block diagram of an exemplary generation of a control signal for the pumping voltage generating circuit of FIG. 2 according to one embodiment.

FIG. 4 is a schematic block diagram of an exemplary generation of a control signal for the pumping voltage generating circuit 2 of FIG. 2 according to one embodiment. In FIG. 4, the first control signal 'ctrl1' can be generated by the delay unit 500 to delay the first oscillation signal 'osc1'. A level shifter 600, which can shift the voltage level of the output signal of the delay unit 500, can be additionally provided in order to prevent a voltage drop of the transistor by enlarging the strength of the turn-ON characteristics of the fourth and fifth transistors N14 and N15 in the first control pump 310. Accordingly, the delay time of the delay unit 500 can be one-fourth (¼) of the period of the first oscillation signal 'osc1', and the swing level of the output signal of the level shifter 600 can be twice as much as the voltage difference between the ground voltage VSS and the external power supply voltage VDD.

The first control signal 'ctrl1' is at a high level before the first oscillation signal 'osc1' is transitioned to a high level. Accordingly, before the first oscillation signal 'osc1' is transitioned to a high level, the fourth and fifth transistor N14 and N15 can be turned ON.

After the fourth and fifth transistor N14 and N15 are turned ON, the first oscillation signal 'osc1' can be input into the first and second pump capacitors pump_cap11 and pump_cap12. Thus, the voltage level on the first node (node_A) can be increased through the two pump capacitors pump_cap11 and pump_cap12.

Before the first oscillation signal 'osc1' is transitioned to a low level, the first control signal 'ctrl1' can be at a low level. Accordingly, before the first oscillation signal 'osc1' is transitioned to a low level, the fourth and fifth transistor N14 and N15 can be turned OFF.

After the fourth and fifth transistor N14 and N15 are turned OFF, the first oscillation signal 'osc1' can be input into only the first pump capacitor pump_cap11. Thus, the voltage level on the first node (node_A) can be reduced through the first pump capacitor pump_cap11.

As comparing the current consumed when the first oscillation signal 'osc1' is transitioned to a high level, i.e., when the voltage level on the first node (node_A) is increased with that consumed when the first oscillation signal 'osc1' is transited to a low level, the first pumping unit 300 can consume much more current when the voltage level on the first node (node_A) is increased.

Since the current consumed when the oscillation signal can be transitioned to a high level can be more than that when the oscillation signal is transitioned to a low level, the voltage increment, on each of the nodes, can be larger than the voltage decrement. Accordingly, the pumping voltage generating circuit can be much more effective because the voltage increment is larger than the voltage decrement on each node.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A pumping voltage generating circuit in a semiconductor memory apparatus, comprising:
    a voltage supplying unit configured to supply an external power supply voltage to a first node in response to a first transfer signal;
    a node control unit configured to couple the first node to a second node in response to a second transfer signal and to couple the second node to an output node in response to a third transfer signal;
    a first pumping unit configured to increase a voltage level on the first node through a pumping operation that is performed in response to a first oscillation signal and to control one of an amount of voltage increment and decrement on the first node in response to a first control signal; and
    a second pumping unit configured to increase a voltage level on the second node through a pumping operation that is performed in response to a second oscillation signal and to control one of an amount of voltage increment and decrement on the second node in response to a second control signal;
    wherein the first pumping unit includes:
        a first pump capacitor for performing a pumping operation according to the first oscillation signal; and
        a first control pump for performing a pumping operation according to the first oscillation signal when the first control signal is activated, the first control pump including:
            a second pump capacitor;
            a first switch for transferring the first oscillation signal to one end of the second pump capacitor in response to the first control signal; and
            a second switch for coupling the other end of the second pump capacitor to the first node in response to the first control signal.

2. The pumping voltage generating circuit of claim 1, further comprising:
    a first delay unit configured to generate the first control signal by delaying the first oscillation signal; and
    a second delay unit configured to generate the second control signal by delaying the second oscillation signal.

3. The pumping voltage generating circuit of claim 1, wherein the first pumping unit has a capacitance that is increased when the first control signal is activated.

4. The pumping voltage generating circuit of claim 1, wherein the first pumping unit has a capacitance that is decreased when the first control signal is inactivated.

5. The pumping voltage generating circuit of claim 1, wherein the first pump capacitor has one end to which the first oscillation signal is supplied and the other end to which the first node is connected.

6. The pumping voltage generating circuit of claim 1, wherein the second pumping unit has a capacitance that is increased when the second control signal is activated.

7. The pumping voltage generating circuit of claim 6, wherein the second pumping unit includes:
    a third pump capacitor for performing a pumping operation according to the second oscillation signal; and a second control pump for performing a pumping operation according to the second oscillation signal when the second control signal is activated.

8. The pumping voltage generating circuit of claim 7, wherein the third pump capacitor has one end to which the second oscillation signal is supplied and the other end to which the second node is connected.

9. The pumping voltage generating circuit of claim 8, wherein the second control pump includes:
a fourth pump capacitor;
a third switch for transferring the second oscillation signal to one end of the fourth pump capacitor in response to the second control signal; and
a fourth switch for coupling the other end of the fourth pump capacitor to the second node in response to the second control signal.

10. The pumping voltage generating circuit of claim 1, wherein the second pumping unit has a capacitance that is decreased when the second control signal is inactivated.

11. The pumping voltage generating circuit of claim 10, wherein the second pumping unit includes:
a third pump capacitor for performing a pumping operation according to the second oscillation signal; and
a second control pump for performing a pumping operation according to the second oscillation signal when the second control signal is activated.

12. The pumping voltage generating circuit of claim 11, wherein the third pump capacitor has one end to which the second oscillation signal is supplied and the other end to which the second node is connected.

13. The pumping voltage generating circuit of claim 12, wherein the second control pump includes:
a fourth pump capacitor;
a third switch for transferring the second oscillation signal to one end of the fourth pump capacitor in response to the second control signal; and
a fourth switch for coupling the other end of the fourth pump capacitor to the second node in response to the second control signal.

14. A pumping voltage generating circuit in a semiconductor memory apparatus, comprising:
a pumping unit configured to increase capacitance before one of rising timing and falling timing of an oscillation signal at a first phase, to decrease capacitance at a second phase of the oscillation signal, and to perform a pumping operation in response to the oscillation signal,
wherein the second phase of the oscillation signal is out of phase with the first phase of the oscillation signal,
and wherein the pumping unit includes:
a first pump capacitor for performing a pumping operation in response to the oscillation signal when a control signal is activated, wherein the first pump capacitor is coupled to an output node of the control pump,
and wherein the control pump includes:
a second pump capacitor;
a first switch for transferring the oscillation signal to one end of the second pump capacitor in response to the control signal; and
a second switch for coupling the other end of the second pump capacitor to the output node in response to the control signal.

15. The pumping voltage generating circuit of claim 14, further comprising a delay unit configured to generate the control signal by delaying the oscillation signal.

16. A semiconductor memory apparatus, comprising:
a pumping voltage generating circuit including:
a voltage supplying unit configured to supply an external power supply voltage to a first node in response to a first transfer signal;
a node control unit configured to couple the first node to a second node in response to a second transfer signal; and
a plurality of pumping units configured to increase a voltage level on one of the first node and the second node through a pumping operation performed in response to one of a first oscillation signal and a second oscillation signal;
wherein the first one of the plurality of pumping units includes:
a first pump capacitor for performing a pumping operation according to the first oscillation signal; and
a first control pump for performing a pumping operation according to the first oscillation signal when the first control signal is activated, the first control pump including:
a second pump capacitor;
a first switch for transferring the first oscillation signal to one end of the second pump capacitor in response to the first control signal; and
a second switch for coupling the other end of the second pump capacitor to the first node in response to the first control signal.

17. The semiconductor memory apparatus of claim 16, wherein the node control unit is configured to couple the second node to an output node in response to a third transfer signal.

18. The semiconductor memory apparatus of claim 16, wherein a first one of the plurality of pumping units is configured to control one of an amount of voltage increment and decrement on the first node in response to the first control signal.

19. The semiconductor memory apparatus of claim 18, wherein a second one of the plurality of pumping units is configured to control one of an amount of voltage increment and decrement on the second node in response to a second control signal.

20. The semiconductor memory apparatus of claim 19, wherein the second one of the plurality of pumping units includes:
a third pump capacitor for performing a pumping operation according to the second oscillation signal; and
a second control pump for performing a pumping operation according to the second oscillation signal when the second control signal is activated.

21. The semiconductor memory apparatus of claim 16, further comprising a plurality of delay units configured to generate the first control signal by delaying the first oscillation signal and to generate the second control signal by delaying the second oscillation signal.

* * * * *